United States Patent
Niebojewski et al.

(10) Patent No.: US 8,822,332 B2
(45) Date of Patent: Sep. 2, 2014

(54) METHOD FOR FORMING GATE, SOURCE, AND DRAIN CONTACTS ON A MOS TRANSISTOR

(71) Applicants: STMicroelectronics S.A., Montrouge (FR); Commissariat à l'Énergie Atomique et aux Énergies Alternatives, Paris (FR)

(72) Inventors: Heimanu Niebojewski, Grenoble (FR); Yves Morand, Grenoble (FR); Cyrille Le Royer, Tullins (FR); Fabrice Nemouchi, Moirans (FR)

(73) Assignees: STMicroelectronics S.A., Montrouge (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 13/871,884

(22) Filed: Apr. 26, 2013

(65) Prior Publication Data
US 2013/0295734 A1    Nov. 7, 2013

(30) Foreign Application Priority Data
May 4, 2012    (FR) .................................... 12 54145

(51) Int. Cl.
*H01L 21/311*    (2006.01)
*H01L 21/28*    (2006.01)
*H01L 29/66*    (2006.01)
*H01L 21/768*    (2006.01)

(52) U.S. Cl.
CPC .... *H01L 29/66477* (2013.01); *H01L 21/28247* (2013.01); *H01L 21/76897* (2013.01); *H01L 29/66606* (2013.01); *H01L 29/66545* (2013.01)
USPC ........... 438/649; 257/412; 257/413; 257/755; 438/650; 438/655

(58) Field of Classification Search
USPC ......... 257/288, 369, 382, 384, 413, 412, 755; 438/197, 199, 299, 305, 649, 650, 655
See application file for complete search history.

(56) References Cited

U.S. PATENT DOCUMENTS 5,960,270 A * 9/1999 Misra et al. ................... 438/197
6,198,143 B1    3/2001 Ohsaki
(Continued)

OTHER PUBLICATIONS

French Search Report Search Report and Written Opinion from corresponding French Patent Application No. 12/54145 dated Jan. 7, 2013.

*Primary Examiner* — Errol Fernandes
(74) *Attorney, Agent, or Firm* — Wolf, Greenfield & Sacks, P.C.

(57) ABSTRACT

A method for forming gate, source, and drain contacts on a MOS transistor having an insulated gate including polysilicon covered with a metal gate silicide, this gate being surrounded with at least one spacer made of a first insulating material, the method including the steps of a) covering the structure with a second insulating material and leveling the second insulating material to reach the gate silicide; b) oxidizing the gate so that the gate silicide buries and covers the a silicon oxide; c) selectively removing the second insulating material; and d) covering the structure with a first conductive material and leveling the first conductive material all the way to a lower level at the top of the spacer.

12 Claims, 14 Drawing Sheets

(56) References Cited

U.S. PATENT DOCUMENTS

| | | |
|---|---|---|
| 2009/0191703 A1 | 7/2009 | Lu et al. |
| 2009/0227082 A1 | 9/2009 | Shin et al. |
| 2011/0037105 A1* | 2/2011 | Chang .......................... 257/288 |
| 2011/0042752 A1 | 2/2011 | Mayuzumi |
| 2012/0088359 A1 | 4/2012 | Kim et al. |

* cited by examiner

METHOD FOR FORMING GATE, SOURCE, AND DRAIN CONTACTS ON A MOS TRANSISTOR

CROSS REFERENCE TO RELATED APPLICATIONS

This application claims the priority benefit of French patent application Ser. No. 12/54145, filed on May 4, 2012, which is hereby incorporated by reference to the maximum extent allowable by law.

BACKGROUND

1. Technical Field

The present disclosure relates to a method for forming gate, source, and drain contacts on MOS transistor of nanometric dimensions.

2. Discussion of the Related Art

FIGS. 1 and 2 are cross-section views schematically illustrating successive steps of a method currently used to form gate, source, and drain contacts on MOS transistors.

FIG. 1 is a cross-section view schematically showing a portion of a semiconductor wafer on which MOS transistors have been formed.

The upper portion of a semiconductor wafer 1 has insulation regions 3, for example, trenches filled with an insulating material, extending therein. Insulating regions 3 delimit active areas 5 of wafer 1 where MOS transistors are formed. In FIG. 1, two MOS transistors having a common source/drain region are formed in a same active area. Each MOS transistor comprises a conductive gate 7 extending on wafer 1 and insulated therefrom by a gate insulator 9. Each gate 7 is surrounded with a spacer 11 made of an insulating material. Source and drain regions 13 extend in wafer 1 on either side of gates 7. Source and drain regions 13 and gates 7 are covered with a metal silicide 15, 16. Reference 15 designates the metal silicide, called gate silicide, covering gates 7, and reference 16 designates the metal silicide covering source and drain regions 13. An insulating material 17 has been deposited on wafer 1 to cover gates 7 coated with gate silicide 15.

FIG. 2 illustrates the structure after the forming of source, drain, and gate contacts on the MOS transistors. Insulating material 17 has first been leveled, for example, by a chem.-mech. polishing method. Openings 19 have then been formed in material 17, from the upper surface of material 17, to reach gate silicide 15 and metal silicide 16 covering source and drain regions 13. The openings providing access to gate silicide 15 are not shown in FIG. 2, since they are usually formed above gate portions covered with metal silicide located on insulating regions 3, outside of active area 5. To form openings 19, a mask has been used during a prior photolithography step to protect the areas of layer 17 which are not desired to be etched. Openings 19 have then been filled with a conductive material 21. Openings 19 filled with conductive material 21 form source, drain, and gate contacts 23 of the MOS transistors, where the gate contacts are not shown in the cross-section plane of FIG. 2.

Further, the sizes of MOS transistors, and especially their gate length $L_g$ and spacing $d_g$ between the gates of two adjacent MOS transistors are continuously decreased.

For particularly small dimensions $L_g$ and $d_g$, for example, respectively on the order of 14 nm and on the order of 64 nm, it is difficult to properly align the mask defining openings 19 with respect to the source and drain regions and with respect to the gate. A misalignment of the contacts risks generating short-circuits between the source and drain regions and the gates of MOS transistors.

There is a need for a method for forming gate, source, and drain contacts on MOS transistors avoiding short-circuits between the source and drain regions and the gates of MOS transistors having a gate length smaller than 20 nm.

SUMMARY

Thus, an embodiment provides a method for forming gate, source, and drain contacts on a MOS transistor having an insulated gate comprising polysilicon covered with a metal gate silicide, this gate being surrounded with at least one spacer made of a first insulating material, the method comprising the steps of a) covering the structure with a second insulating material and leveling the second insulating material to reach the gate silicide; b) oxidizing the gate so that the gate silicide buries and covers with a silicon oxide; c) selectively removing the second insulating material; and d) covering the structure with a first conductive material and leveling the first conductive material all the way to a lower level at the top of said spacer.

According to an embodiment, the method further comprises, after step d) of leveling of the first conductive material, the steps of e) covering the structure with a layer of a third insulating material; f) forming openings in the third insulating material to reach said first conductive material; and g) filling the openings with a second conductive material.

According to an embodiment, at step a), the second insulating material covering the structure is a silicon oxide, and at step c), the silicon oxide formed at step b) is also removed.

According to an embodiment, at step e), the third insulating material covering the structure is of same nature as the second insulating material.

According to an embodiment, at step g), the second conductive material for filling said openings is of same nature as the first conductive material.

According to an embodiment, the gate silicide is a silicide based on at least one metal selected from the group comprising nickel, cobalt, palladium, chromium, and platinum.

According to an embodiment, said at least one spacer is made of silicon nitride.

According to an embodiment, the first and second conductive materials are selected from the group comprising tungsten, copper, titanium nitride, and tantalum nitride.

According to an embodiment, the gate is formed by deposition of a stack of conductive layers comprising a titanium nitride layer coated with a polysilicon layer and with a metal silicide.

According to an embodiment, at step b) of oxidation of the gate, the structure is taken to a temperature lower than 700° C., preferably lower than 600° C.

According to an embodiment, the structure is formed on a layer of a first semiconductor material laid on an insulating layer, itself laid on a substrate of a second semiconductor material.

According to an embodiment, the method further comprises, after the forming of the gate and before the forming of the gate silicide, a step at which the epitaxy of the source and drain regions is resumed.

According to an embodiment, for P-channel MOS transistors, formed in a layer of a first silicon semiconductor material, an epitaxial silicon-germanium layer is formed on the source and drain regions.

The foregoing and other features and advantages will be discussed in detail in the following non-limiting description of specific embodiments in connection with the accompanying drawings.

BRIEF DESCRIPTION OF THE DRAWINGS

FIGS. 3A-4A and 3B-4B respectively are cross-section and top views schematically illustrating successive steps of a possible method for forming self-aligned source, drain, and gate contacts on MOS transistors;

FIGS. 5A to 9A and 5B to 9B respectively are cross-section and top views schematically illustrating successive steps of an embodiment of a method for forming self-aligned source, drain, and gate contacts on MOS transistors; and FIGS. 10A to 20A and 10B to 20B respectively are cross-section and top views schematically illustrating successive steps of a specific example of a method for forming self-aligned source, drain, and gate contacts on MOS transistors.

For clarity, the same elements have been designated with the same reference numerals in the different drawings and, further, as usual in the representation of integrated circuits, the various drawings are not to scale.

DETAILED DESCRIPTION

FIGS. 3A-4A and 3B-4B respectively are cross-section and top views schematically illustrating successive steps of a possible method for forming source, drain, and gate contacts on MOS transistors, without using a mask defining the contacts (self-aligned contacts).

Figure 1:
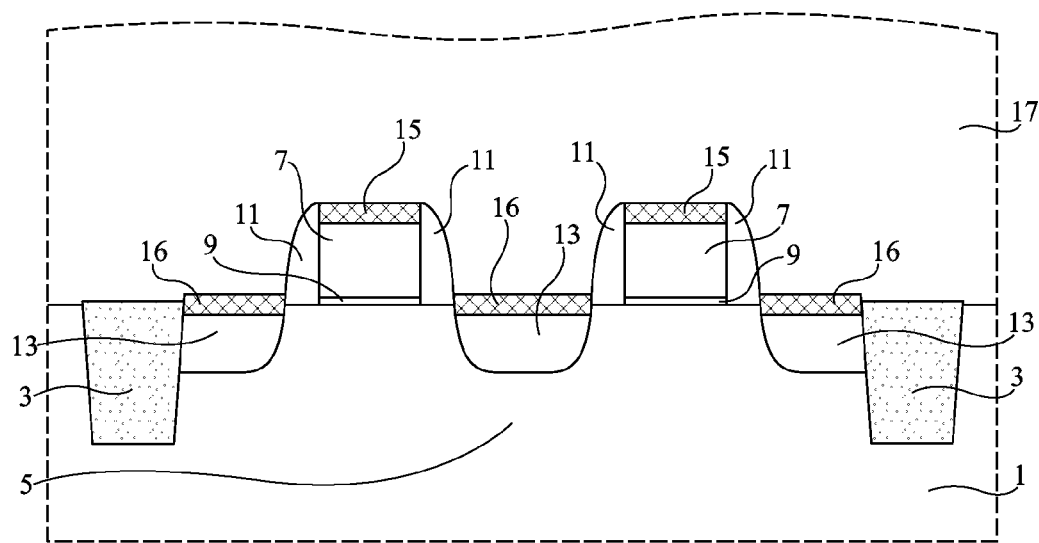
FIGS. 1 and 2, previously described, are cross-section views schematically illustrating successive steps of a method currently used to form source, drain, and gate contacts on MOS transistors.
Figure 2:
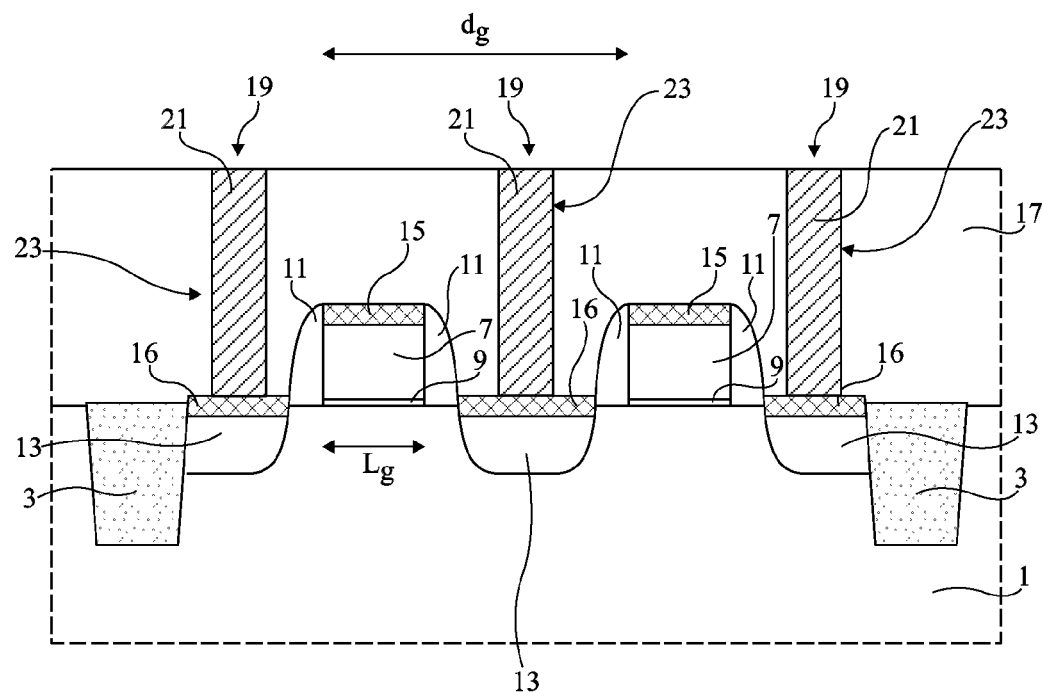
Figure 3A:
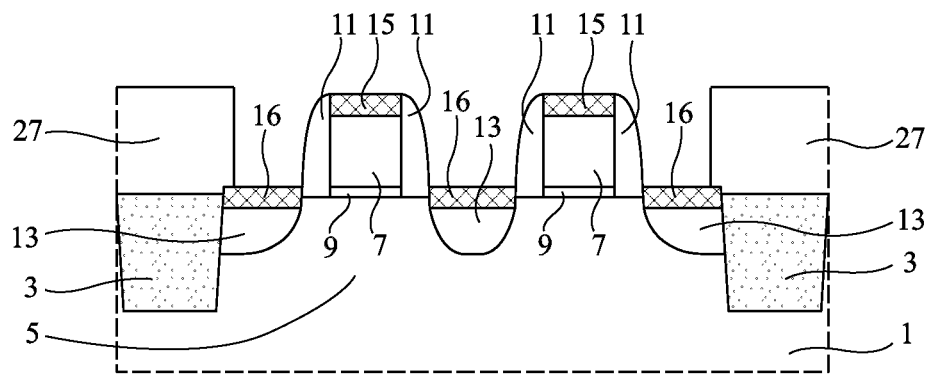
Figure 3B:
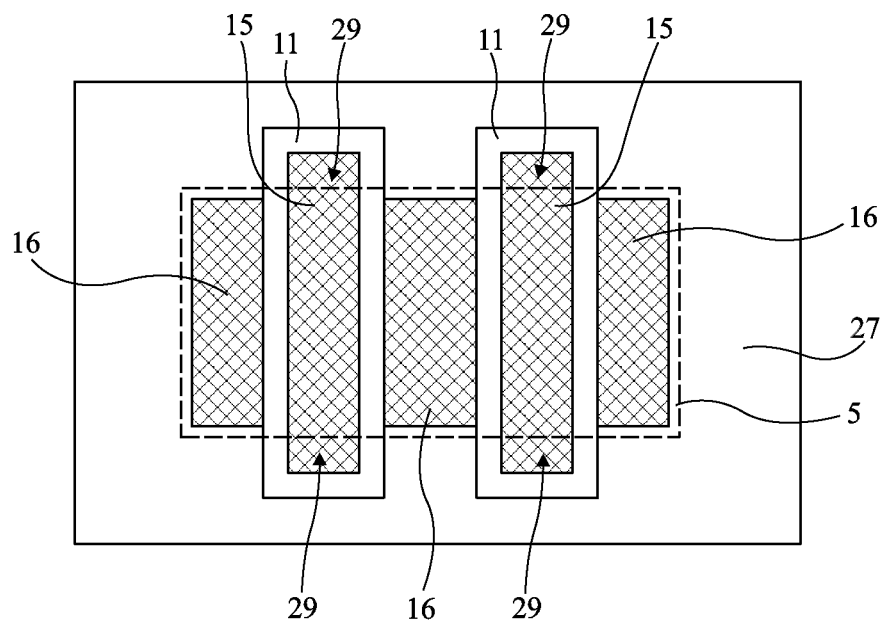

FIG. 3A is a cross-section view schematically showing a structure of the type illustrated in FIG. 1. FIG. 3B is a top view corresponding to FIG. 3A. These drawings show the components of two adjacent MOS transistors already described in relation with FIG. 1 and designated with the same reference numerals. Insulating layer 17 of FIG. 1 has been leveled and thinned to the level of gate silicides 15, and then only maintained outside of active area 5 to form a frame 27.

Figure 4A:
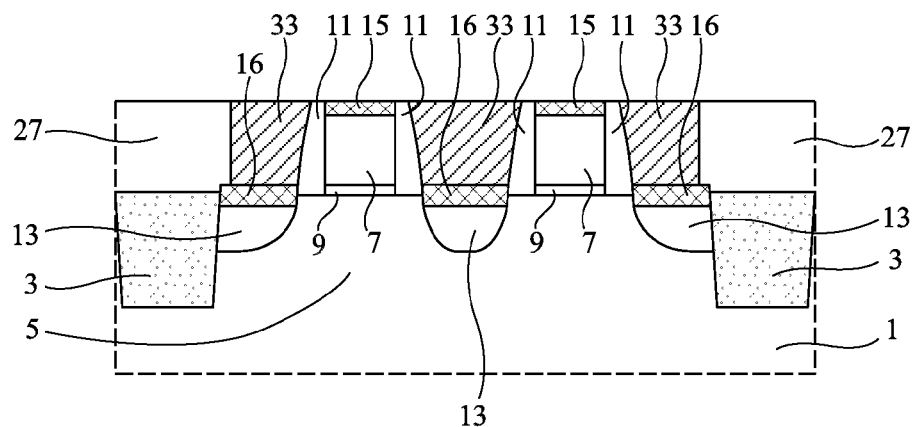
Figure 4B:
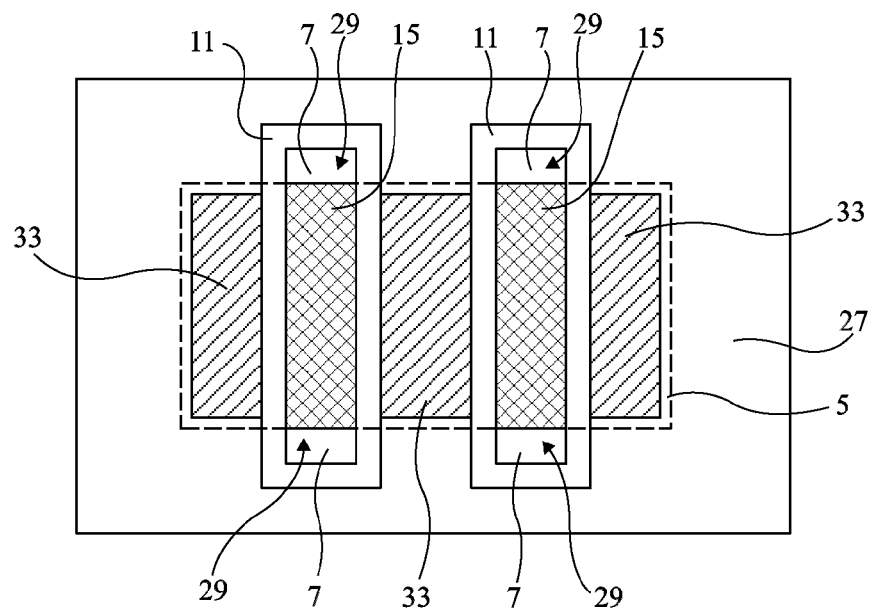

FIGS. 4A and 4B illustrate the structure after the deposition of a conductive material 33, for example, a metallic material, followed by the leveling of conductive material 33, for example, by a chemical mechanical polishing (CMP). Conductive material 33 is leveled to a lower level at the top of spacers 11 so that the portions of conductive material 33 covering metal silicide 16 located on the source and drain regions are electrically insulated from gate silicide 15.

Further, the stopping of the polishing of conductive material 33 is actually extremely difficult to adequately control.

If it is stopped too soon, when the gate silicide has just been reached, the lateral insulation between conductive material 33 and gate silicide 15 will be insufficient and the device risks being defective. Further, it is difficult to detect an end-of-etching of conductive material 33 when metal gate silicide 15 is reached.

If it is stopped too soon, the thickness of metal silicide 15 remaining on the gate will not be sufficient to enable to then take a satisfactory contact on this silicide. This last issue results from the small initial thickness of gate silicide 15 (for example, on the order of 20 nm) and is made worse by the fact that the gate contacts are taken on portions 29 of the gate, located above insulation regions 3 (FIGS. 3B and 4B), which are slightly raised.

A method for forming self-aligned gate, source, and drain contacts on MOS transistors having a very small gate length, typically smaller than 20 nm, has thus been searched out.

FIGS. 5A to 9A and 5B to 9B respectively are cross-section and top views schematically illustrating successive steps of such a method.

Figure 5A:
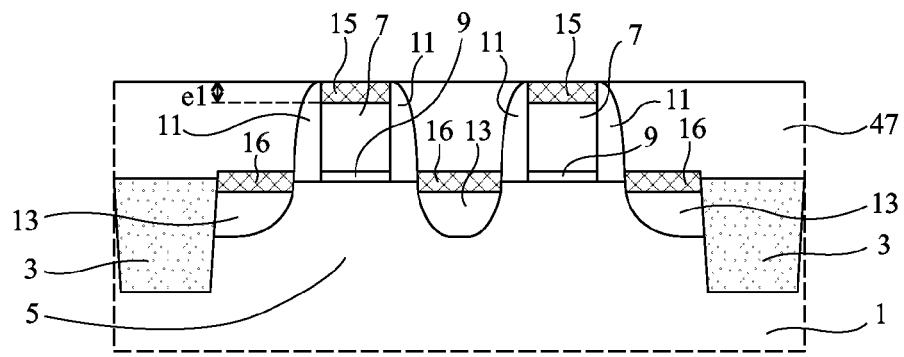
Figure 5B:
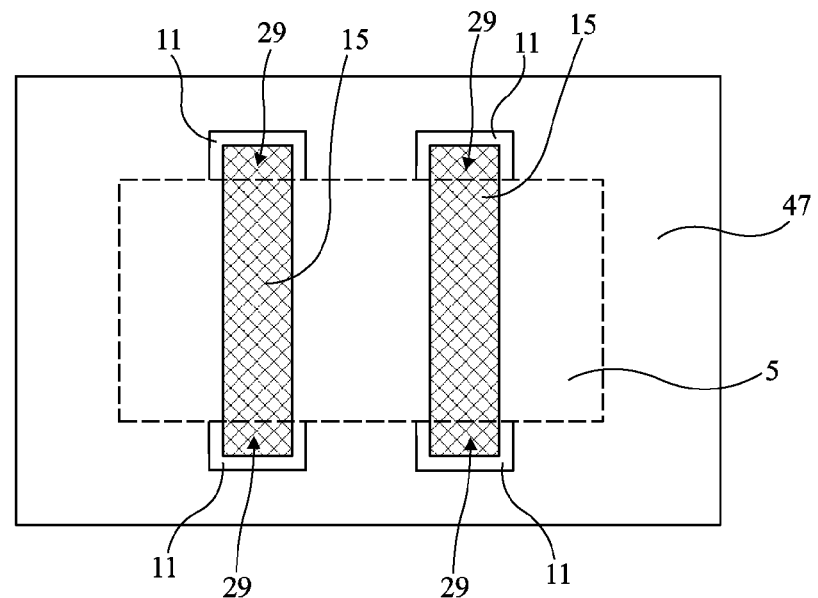

FIG. 5A is a cross-section view schematically showing a structure of the type illustrated in FIG. 1. FIG. 5B is a top view corresponding to FIG. 5A. These drawings show the components of two adjacent MOS transistors already described in relation with FIG. 1 and designated with the same reference numerals.

Conductive gates 7 are for example made of doped polysilicon. Spacers 11 are for example made of silicon nitride or of silicon oxynitride. Metal silicide 15, 16 for example is a nickel silicide, for example NiSi or $NiSi_2$, or a cobalt ($CoSi_2$), palladium (PdSi), chromium ($CrSi_2$), or platinum (PtSi) silicide, or a combination of such silicides such as NiPtSi. Call e1 the thickness of gate silicide 15.

The structure has been covered with an insulating material 47, for example, silicon oxide or a material of low dielectric permittivity, for example, SiOF, SiOCH, or porous SiOCH.

Insulating material 47 has been leveled to reach gate silicide 15. For this purpose, insulating material 47 has first been leveled, for example, by CMP, so that a small thickness of insulating material 47 remains on gate silicide 15 at the level of active area 5. The etching has then been continued by any method, typically a selective plasma etching, enabling to obtain an end-of-etching indication when the upper surface of gate silicide 15 has been reached.

Figure 6A:
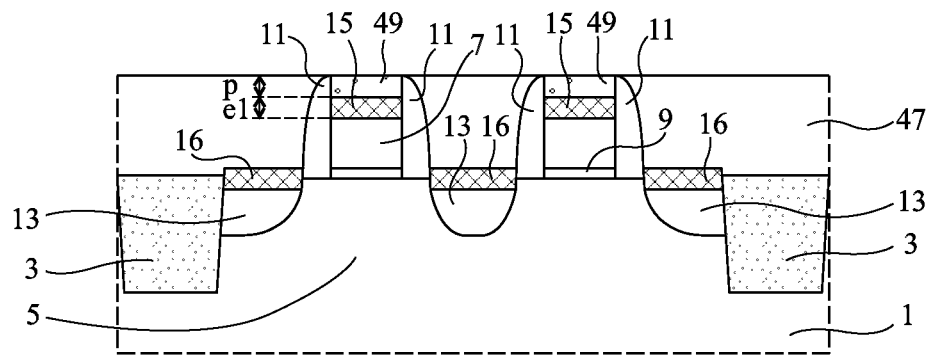
Figure 6B:
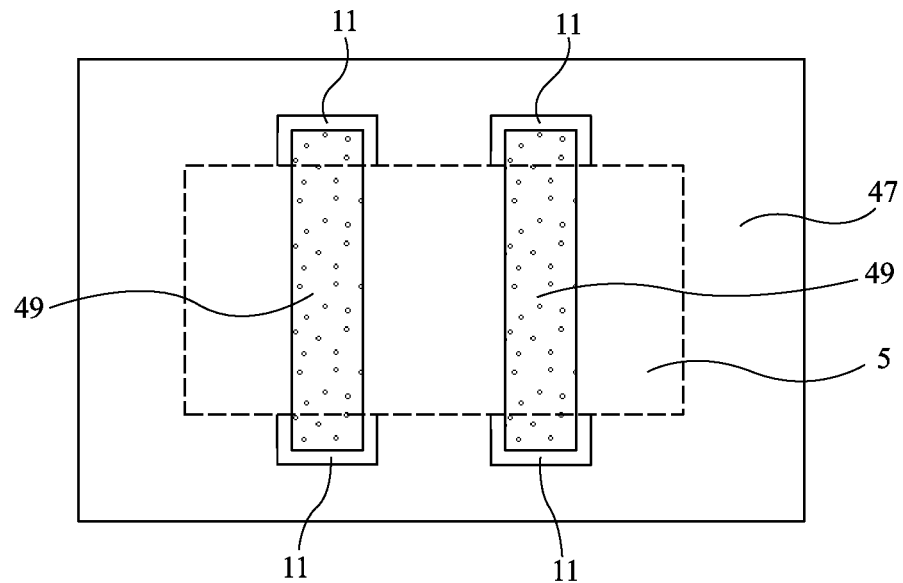

As illustrated in FIGS. 6A and 6B, a thermal oxidation of gates 7 covered with gate silicide 15 is performed. It is gone about so that gate silicide 15, which is initially at the surface above gates 7, "buries" in gate 7 under a silicon oxide 49, while keeping a substantially constant thickness e1 of gate silicide 15. Gate silicide 15 is at a lower level than the top of spacers 11 and silicon oxide 49 extends from the upper surface of gate silicide 15 all the way to the top of spacers 11. Depth p at which gate silicide 15 is buried in gates 7 corresponds to the thickness of silicon oxide 49 which has formed above this gate silicide.

A detailed example of implementation of such a thermal oxidation method, enabling to bury a metal silicide in silicon, under a silicon oxide layer, is described in R. D. Frampton et al., "A study of the oxidation of selected metal silicides", *Journal of Applied Physics* 62 (7), 1987.

In the case of raised source and drain regions, depth p at which gate silicide 15 is buried will preferably be selected so that the lower surface of gate silicide 15 is at a higher level than the upper surface of source and drain metal silicides 16.

As an example of thermal oxidation method, for polysilicon gates 7 and an $NiSi_2$ gate silicide 15, the oxidation of gates 7 is for example performed under oxygen, for example, at a temperature lower than 700° C., preferably at a temperature lower than 600° C. to avoid altering the metal silicide 16 covering source and drain regions 13. For an oxidation time for example ranging between 70 and 80 min, for example, on the order of 75 min, a silicon oxide layer 49 having a thickness for example ranging between 10 and 20 nm, for example, on the order of 15 nm, forms on gate silicide 15.

Figure 7A:
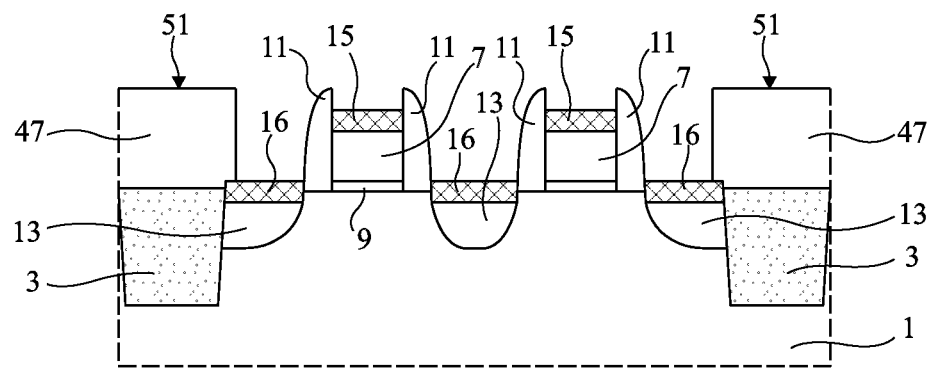
Figure 7B:
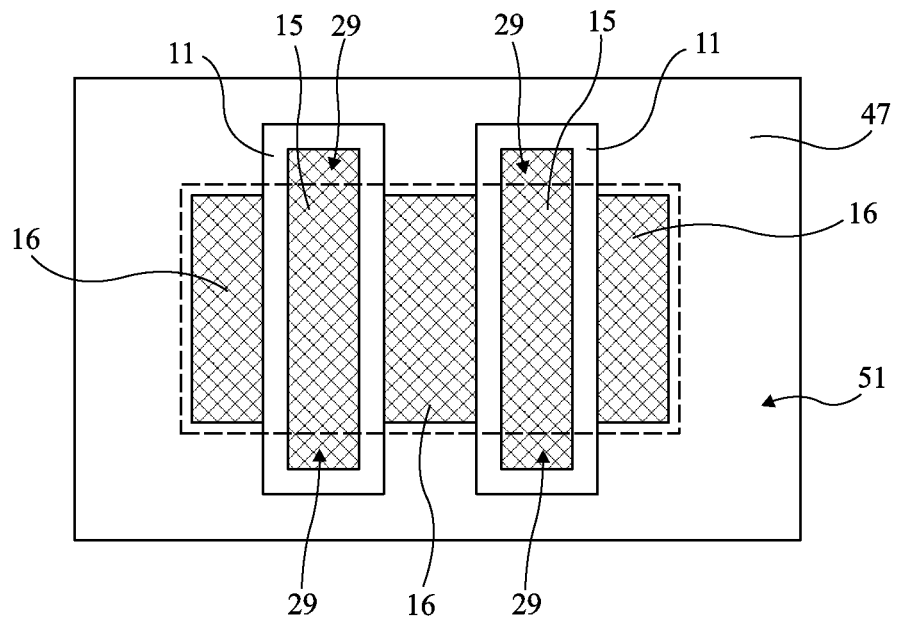

FIGS. 7A and 7B illustrate the structure after the removal of insulating material 47 located on metal silicide 16 covering source and drain regions 13, at the level of active area 5. A mask of non-critical size is used to protect portions 51 of insulating material 47 which are not desired to be etched, especially the portions located above insulation regions 3. Insulating material 47 is removed by an anisotropic etch method. The etch method is selected so that insulating material 47 is etched selectively over the insulating material of spacers 11.

Insulating material 47 covering the structure at the step illustrated in FIGS. 5A and 5B may be silicon oxide so that the silicon oxide 49 which has been formed above gate silicide 15 during the thermal oxidation of the gates is also removed during the etching of insulating material 47. In this case, as shown in FIGS. 7A and 7B, after a partial removal of insulating material 47, gate silicide 15 is at the surface, at a lower level than the top of spacers 11.

Figure 8A:
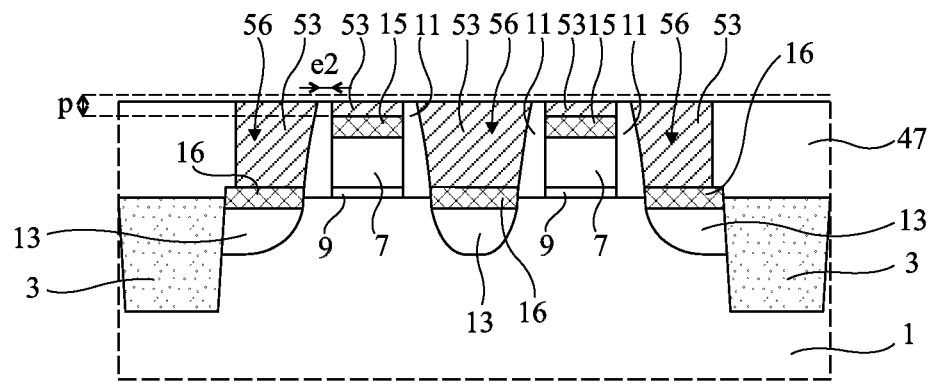
Figure 8B:
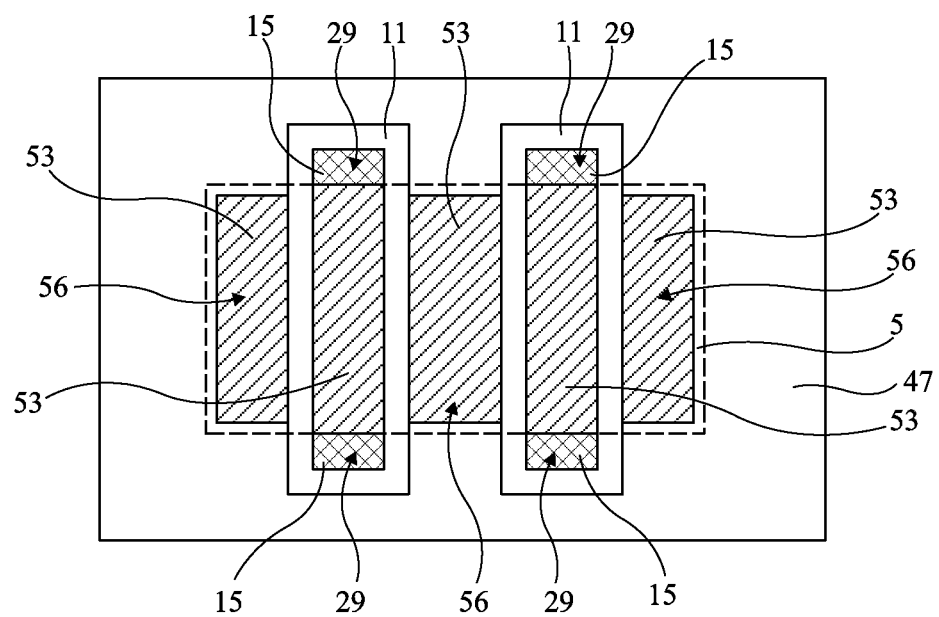

FIGS. 8A and 8B illustrate the structure after the deposition of a conductive material 53 on the structure and leveling thereof, for example, by CMP and by plasma etching. Conductive material 53 for example is a metallic material, for example, tungsten, or a stack of conductive materials, for example, titanium and tungsten nitride, or tantalum and copper nitride, or titanium and copper nitride. Conductive material 53 is leveled to a lower level at the top of spacers 11 so that the portions of conductive material 53 covering metal silicide 16 located on source and drain regions 13 are electrically insulated from gate silicide 15 possibly covered with conductive material 53.

Due to the step of oxidation of the gates illustrated in FIGS. 6A and 6B which has enabled to bury gate silicide 15 at a lower level than the top of spacers 11, the leveling of conductive material 53 may be performed while keeping a sufficient thickness of gate silicide 15 above gates 7, especially at the level of portions 29 of the gates located on slightly raised insulation regions 3. Gate contacts can then be adequately formed on portions 29 of the gates covered with a sufficient thickness of metal silicide 15.

At the end of the step illustrated in FIGS. 8A and 8B, self-aligned source and drain pre-contacts 56 formed of conductive material 53 are obtained.

As shown in FIGS. 8A and 8B, depth p at which gate silicide 15 is buried at the step of thermal oxidation of the gates illustrated in FIGS. 6A and 6B may be selected so that conductive material 53 is maintained on gate silicide 15 at the level of active area 5, and so that a sufficient distance e2 remains between this conductive material and source and drain pre-contacts 56.

An advantage of such a method is that depth p at which gate silicide 15 is buried at the gate oxidation step may be adjusted to reduce stray coupling capacitances between the gates and source and drain pre-contacts 56.

Figure 9A:
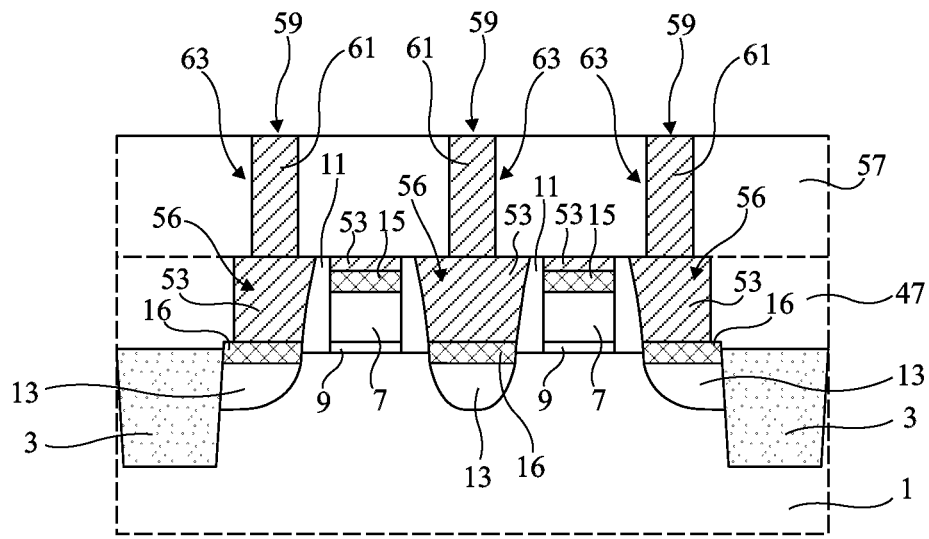
Figure 9B:
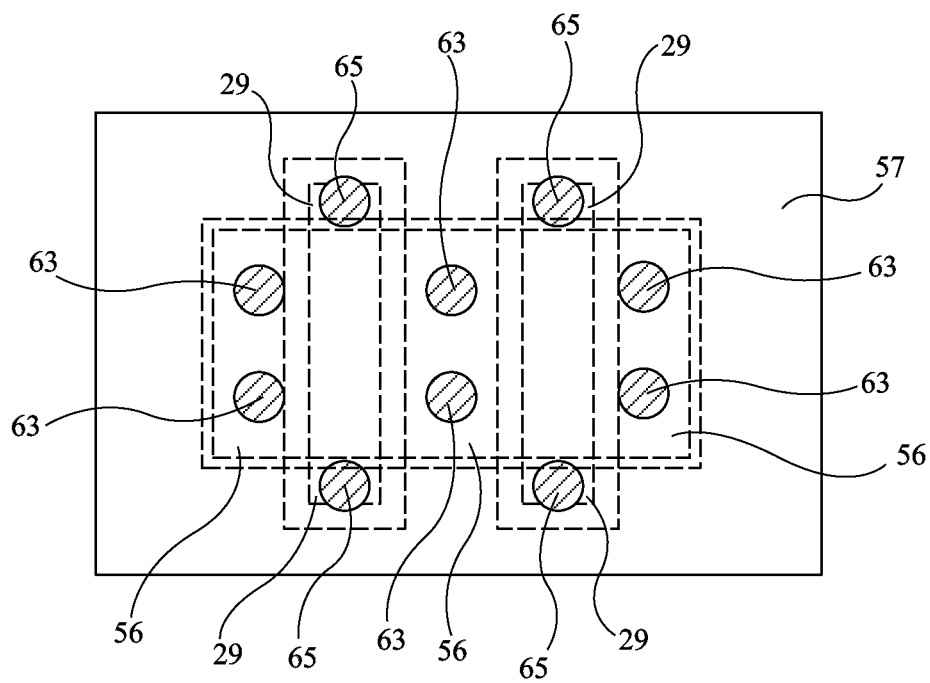

FIGS. 9A and 9B illustrate the structure after the forming of gate contacts and the actual source and drain contacts on the MOS transistors.

A layer of an insulating material 57, for example, of same nature as insulating material 47, has been deposited over the structure. Openings 59 have been formed from the upper surface of insulating material 57 to reach conductive material 53 of source and drain pre-contacts 56 and to reach gate metal silicide 15 covering portions 29 of the gates. To achieve this, a mask has been used to protect the portions of insulating layer 57 which are not desired to be etched. Openings 59 have been formed by an anisotropic etch method selectively etching insulating material 57 over conductive material 53 and over metal silicide 15. Openings 59 have then been filled with a conductive material 61, for example, of same nature as conductive material 53 of source and drain pre-contacts 56. Openings 59 filled with conductive material 61 form the actual source and drain contacts 63 and gate contacts 65 of the MOS transistors, source and drain contacts 63 being connected to source and drain pre-contacts 56 obtained at the step illustrated in FIGS. 8A and 8B. Several source and drain contacts 63 may be formed on each source and drain pre-contact 56, for example two contacts on each pre-contact 56 as shown in FIG. 9B. Similarly, several gate contacts 65 may be formed on portions 29 covered with metal silicide 15 of each gate, for example, a gate contact 65 on each portion 29 located on either side of active area 5.

At the end of the step illustrated in FIGS. 9A and 9B, gate contacts and source and drain contacts are obtained on the MOS transistors, the source and drain contacts being formed of the actual source and drain contacts 63 connected to self-aligned source and drain pre-contacts 56.

An advantage of a method for forming self-aligned source, drain, and gate contacts of the type described in relation with FIGS. 5A to 9A and 5B to 9B is that it does not require using a critical mask. The alignment of the mask used to form gate contacts 65 and source and drain contacts 63 at the step illustrated in FIGS. 9A and 9B is not critical, since the openings defined by this mask instead of directly emerging into the source and drain regions covered with metal silicide of the MOS transistors, emerge on source and drain pre-contacts 56 previously formed in self-aligned fashion on the source and drain regions. This enables to avoiding short-circuits between the source and drain regions and the gate of MOS transistors of very small size.

Further, another advantage of such a method for forming self-aligned source, drain, and gate contacts is that, even in case of a misalignment of the contacts on the source and drain pre-contacts, the presence of spacers enables to decrease the risk of short-circuits between the source/drain regions and the gates of MOS transistors.

EXAMPLE

FIGS. 10A to 20A and 10B to 20B respectively are cross-section and top views schematically illustrating successive steps of a specific example of implementation of the previously-described method for forming self-aligned source, drain, and gate contacts on MOS transistors.

Figure 10A:
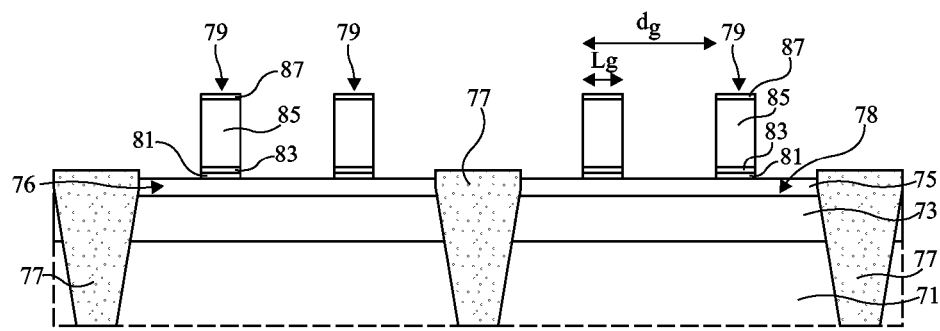
Figure 10B:
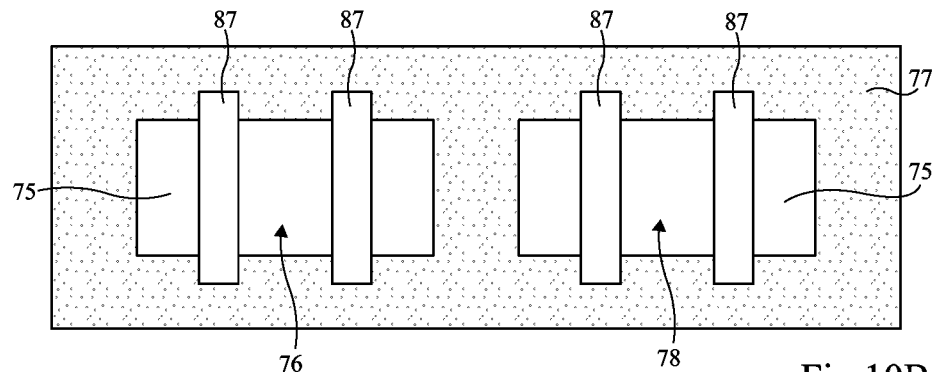

FIG. 10A is a cross-section view schematically showing a portion of a wafer of silicon-on-insulator type (SOI) having MOS transistor gates formed thereon. FIG. 10B is a top view corresponding to FIG. 10A.

A silicon substrate 71 supports a silicon oxide insulating layer 73 currently called BOX ("Buried Oxide"). Insulating layer 73 supports a single-crystal silicon layer 75. The thickness of insulating layer 73 is smaller than or equal to 25 nm and the thickness of single-crystal silicon layer 75 is smaller than or equal to 5 nm. Insulation regions 77 extend in the upper portion of the wafer all the way into substrate 71. Insulation regions 77 for example are trenches of STI ("Shallow Trench Isolation") type filled with silicon oxide. The depth of insulation regions 77 ranges between 100 and 500 nm, for example 250 nm. Insulation regions 77 delimit in single-crystal silicon layer 75 an active area 76 where N-channel MOS transistors are formed and an active area 78 in which P-channel MOS transistors are formed.

Insulated gates 79 have been formed on single-crystal silicon layer 75. To form insulated gates 79, an insulating layer of a material 81 of high dielectric permittivity has been deposited on the structure, and then coated with a stack of a layer of a metallic material 83 and of a polysilicon layer 85. The structure has then been covered with a layer of an insulating material 87.

After a previous photolithography step, the layers of materials 81, 83, 85, and 87 have been etched to form insulated gates 79.

Gate length $L_g$ ranges between 10 and 20 nm, and for example is 14 nm, and spacing $d_g$ between two adjacent gates ranges between 60 and 70 nm, and for example is 64 nm.

Insulating material 81 of high dielectric permittivity is hafnium oxide ($HfO_2$) and its thickness ranges between 0.5 and 2 nm, and for example is 1 nm. Metallic material 83 is titanium nitride (TiN) and its thickness ranges between 4 and 6 nm, and for example is 5 nm. The thickness of polysilicon 85 ranges between 45 and 65 nm, and for example is 50 nm. Insulating material 87 is silicon nitride and its thickness ranges between 5 and 50 nm, and for example is 30 nm.

Figure 11A:
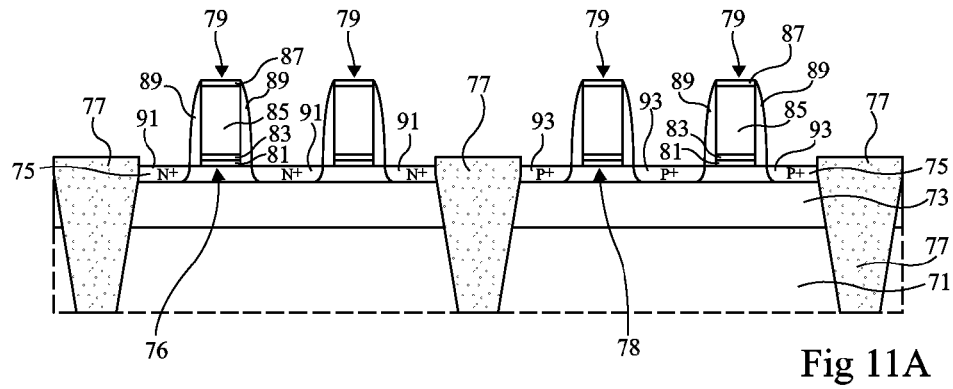
Figure 11B:
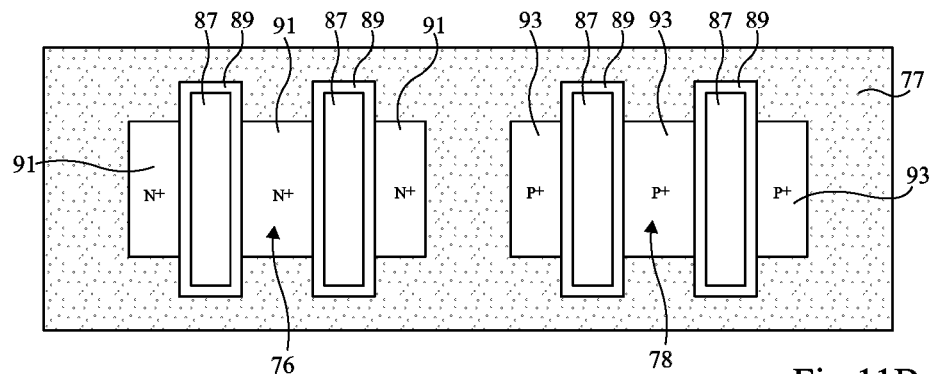

FIGS. 11A and 11B illustrate the structure after the forming of a silicon nitride spacer 89 around insulated gates 79, and after the forming of source and drain 91, 93 in single-crystal silicon layer 75. Reference numeral 91 designates the heavily-doped N-type source and drain regions of the N-channel MOS transistors formed in active area 76. Reference numeral 93 designates the heavily-doped P-type source and drain regions of the P-channel MOS transistors formed in active area 78.

Figure 12A:
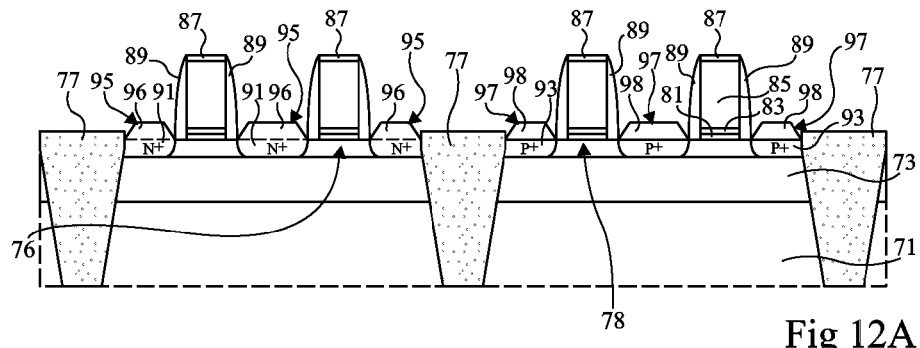
Figure 12B:
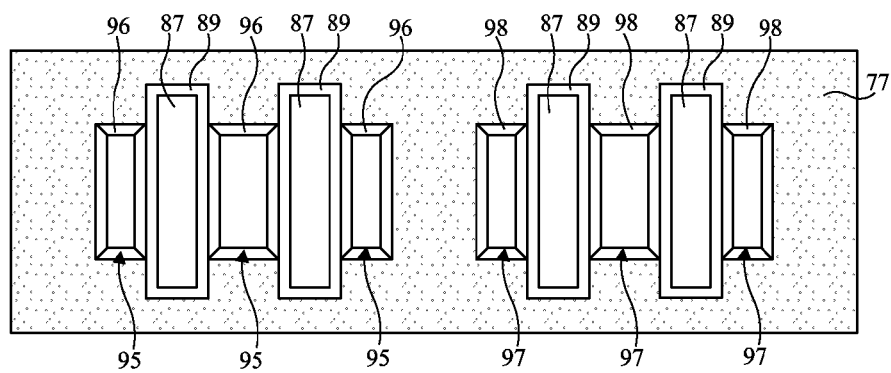

FIGS. 12A and 12B illustrate the structure after the epitaxy of source and drain regions 91, 93 has been resumed to form raised source and drain regions 95, 97. Reference numeral 95 designates the raised source and drain regions of N-channel MOS transistors and reference numeral 97 designates the raised source and drain regions of P-channel MOS transistors. A silicon epitaxial layer 96, doped in-situ and/or by ion implantation, has been formed on source and drain regions 91 of the N-channel MOS transistors, while a silicon-germanium (SiGe) epitaxial layer 98, doped in-situ and/or by ion implantation, has been formed on source and drain regions 93 of the P-channel MOS transistors. A mask has been used to protect active areas 78 during the forming of silicon epitaxial layer 96 on source and drain regions 91 of the N-channel MOS transistors and another mask has been used to protect active areas 76 during the forming of silicon-germanium 98 on source and drain 93 of the P-channel MOS transistors. The thickness of epitaxial layer 96, 98 ranges between 10 and 30 nm, and for example is 15 nm.

Figure 13A:
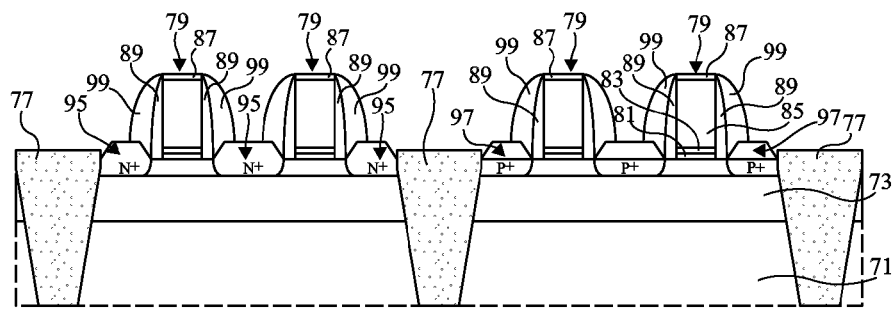
Figure 13B:
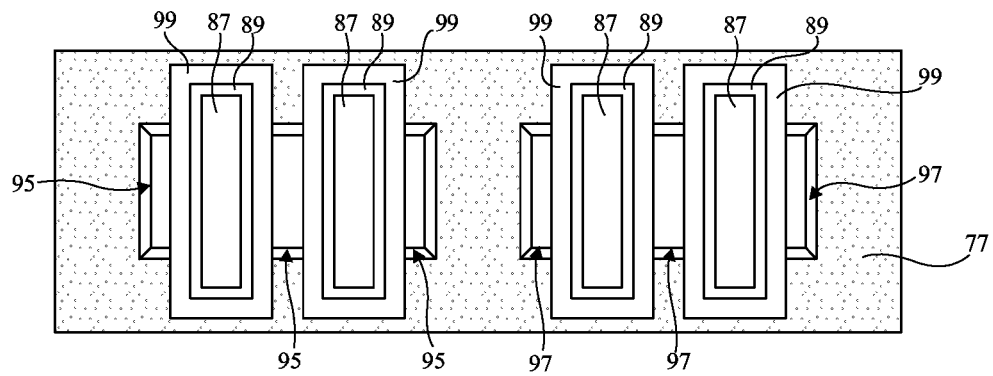

FIGS. 13A and 13B illustrate the structure after the forming of another silicon nitride spacer 99 around insulated gates 79 surrounded with spacer 89. More than two spacers may be formed around insulated gates 79.

Figure 14A:
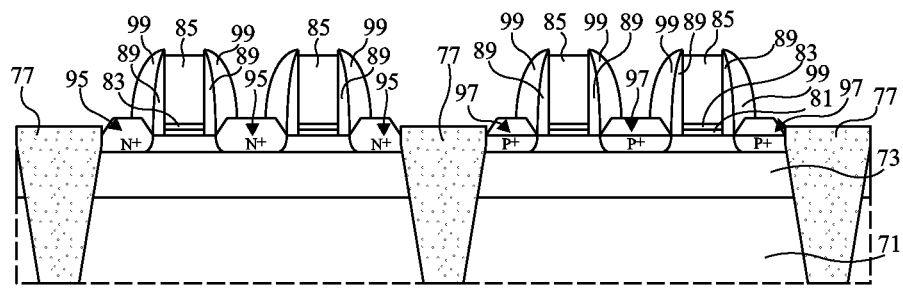
Figure 14B:
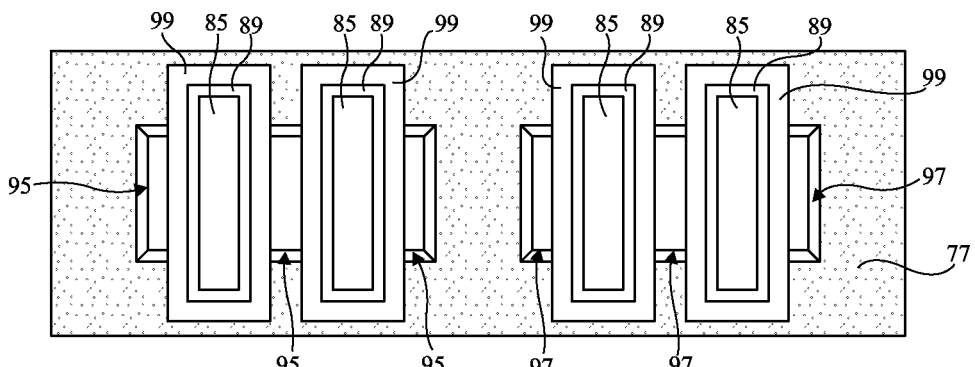

FIGS. 14A and 14B illustrate the structure after the removal of insulating material 87 above gates 79. Polysilicon 85 of gates 79 then is at the surface, at a lower level than the top of spacers 89 and 99. In the case where insulating material 87 is silicon nitride, insulating material 87 may be removed by orthophosphoric acid.

Figure 15A:
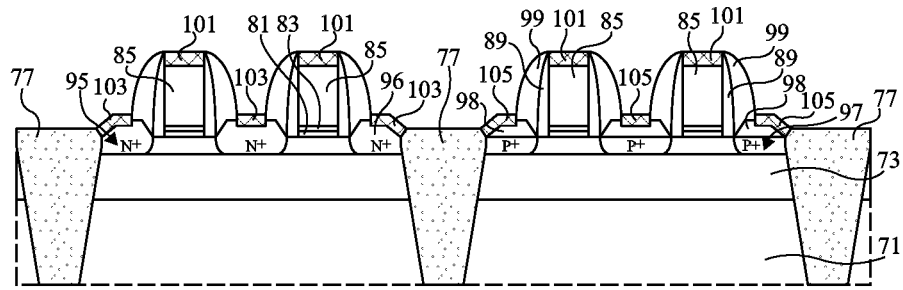
Figure 15B:
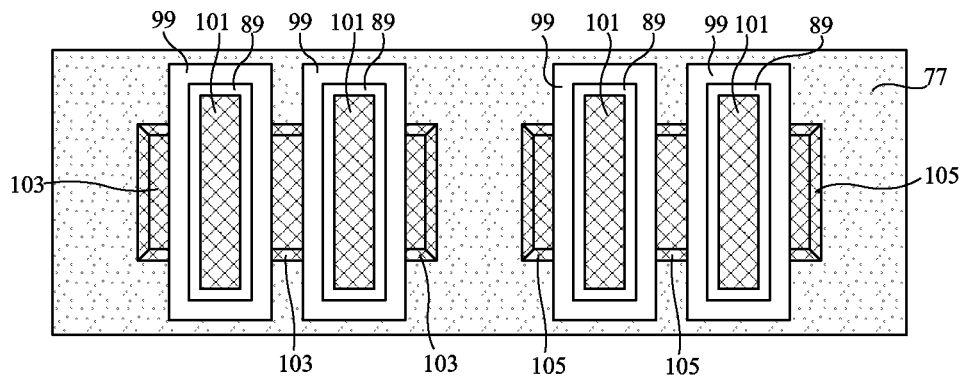

FIGS. 15A and 15B illustrate the structure after the forming of a nickel silicide, for example, NiSi or $NiSi_2$, on raised source and drain regions 95, 97 and on polysilicon 85 of gates 79. To achieve this, a nickel layer has first been deposited on the structure. The structure has then been heated and the excess nickel has been removed by an etch method selective over the silicon nitride of spacers 89 and 99. A nickel silicide 101 is then obtained on gates 79, nickel silicide 101 extending from polysilicon 85 to the top of spacers 89 and 99. A nickel silicide 103 covers raised source and drain regions 95 of the N-channel MOS transistors. A nickel germanium silicide 105 covers raised source and drain regions 97 of the P-channel MOS transistors. The thickness of nickel silicide 101 ranges between 10 and 25 nm, and for example is 20 nm.

Figure 16A:
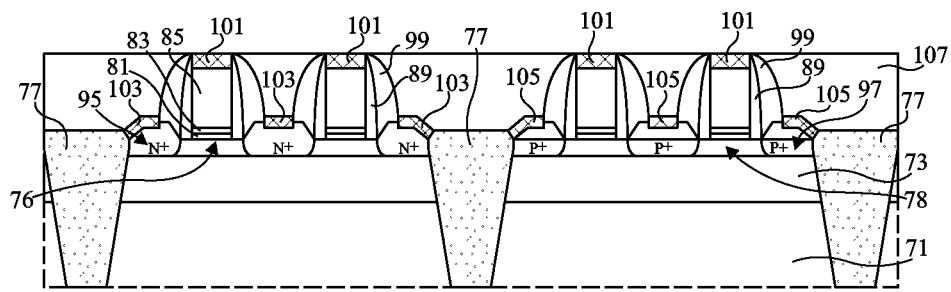
Figure 16B:
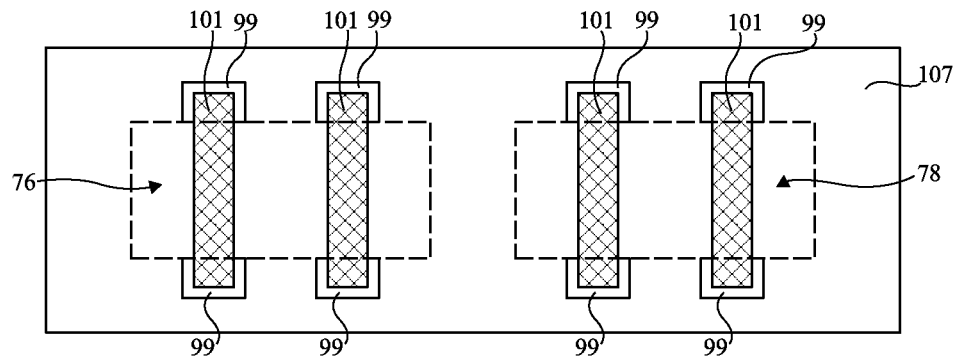

FIGS. 16A and 16B illustrate the structure after the deposition of silicon oxide 107 on the structure and the leveling of silicon oxide 107 to reach gate silicide 101. To achieve this, silicon oxide 107 has for example first been leveled by CMP so that a small thickness of silicon oxide 107 remains on gate silicide 101 at the level of active areas 76, 78. The removal of silicon oxide 107 has for example then been carried on by a plasma etching method selective over gate nickel silicide 101.

Figure 17A:
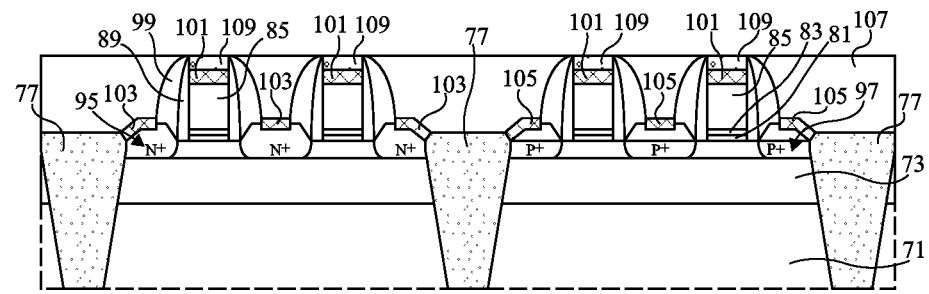
Figure 17B:
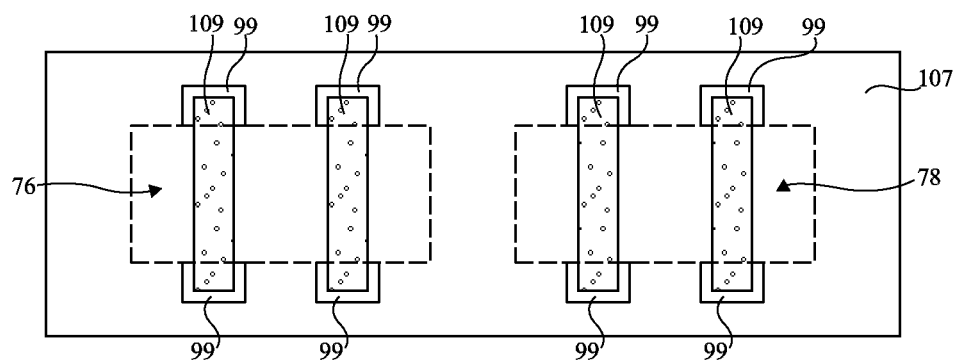

FIGS. 17A and 17B illustrate the structure after a thermal oxidation of the gates covered with nickel silicide 101. The thermal oxidation has been performed so that gate silicide 101 buries in gates 79 and covers with a silicon oxide 109, while keeping a substantially constant thickness of gate silicide 101. In the case of an $NiSi_2$ gate silicide 101, the thermal oxidation has been performed under oxygen at a temperature lower than 600° C., for a time ranging between 10 minutes and several hours, for example, 75 minutes. A silicon oxide thickness 109 approximately ranging from 10 to 20 nm, for example, a thickness on the order of 15 nm, has been obtained on gate silicide 101.

Figure 18A:
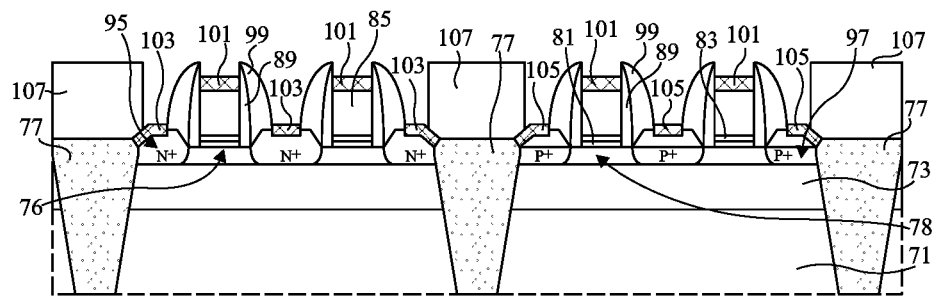
Figure 18B:
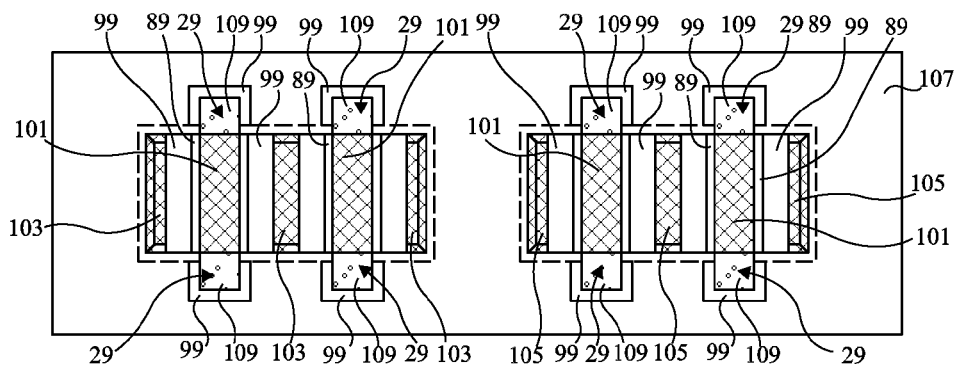

FIGS. 18A and 18B illustrate the structure after the removal of silicon oxide 107 located on nickel silicide 103, 105 covering raised source and drain regions 95, 97, at the level of active areas 76 and 78. A mask has been used to protect the regions of silicon oxide 107 which are not desired to be etched. Silicon oxide 107 has been removed by an anisotropic etch method, for example, a method currently designated as RIE (Reactive Ion Etching) in the art. The etch method is selected to remove silicon oxide 107 selectively over the silicon nitride of spacers 89 and 99. Silicon oxide 109 which has formed above gate silicide 101 at the step illustrated in FIGS. 17A and 17B is also removed on removal of silicon oxide 107. Portions 29 of the gates covered with gate silicide 101 buried under silicon oxide 109 may have been protected by the mask. At the end of the step illustrated in FIGS. 18A and 18B, gate silicide 101 is at the surface, at a lower level than the top of spacers 89 and 99.

Figure 19A:
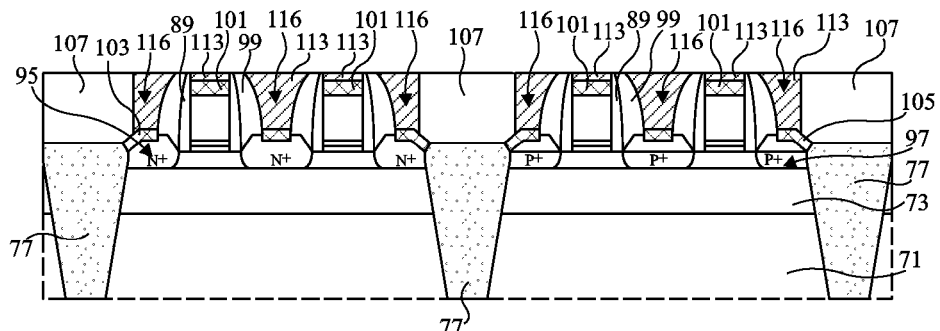
Figure 19B:
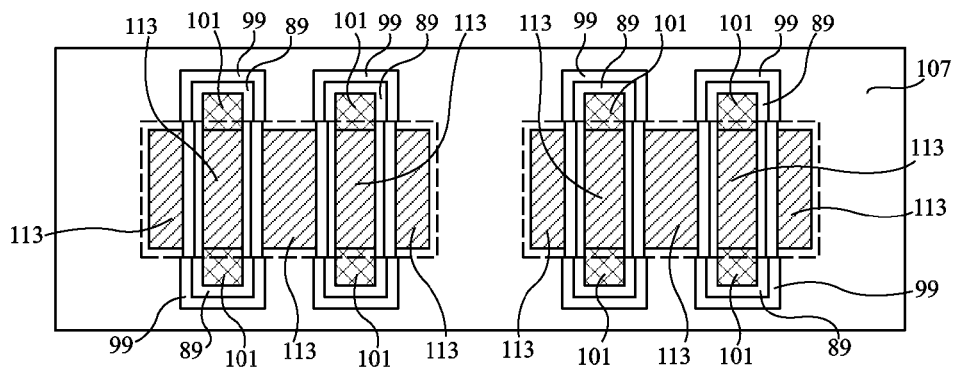

FIGS. 19A and 19B illustrate the structure after the deposition of tungsten 113 on the structure and after CMP leveling. Tungsten 113 is leveled to a lower level than the top of spacers 89 and 99. After the leveling of tungsten 113, tungsten 113 may remain on gate silicide 101 at the level of active areas 76, 78, for example, a thickness of tungsten 113 ranging between 2 and 10 nm, for example, on the order of 5 nm. At the end of the step illustrated in FIGS. 19A and 19B, self-aligned source and drain pre-contacts 116 formed of tungsten 113 are obtained.

Figure 20A:
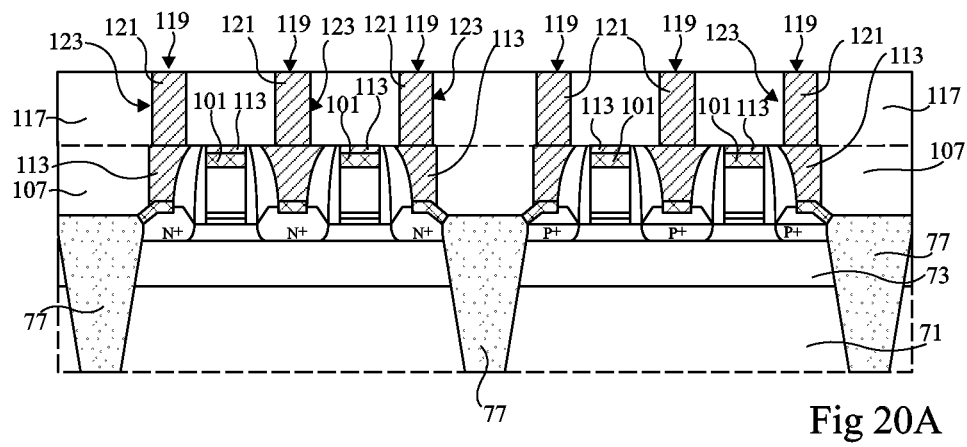
Figure 20B:
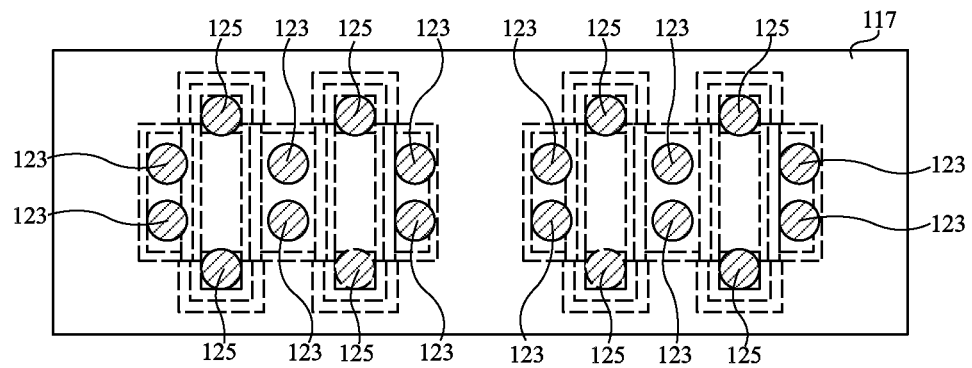

FIGS. 20A and 20B illustrate the structure after the forming of gate contacts and of the actual source and drain contacts on the MOS transistors. A silicon oxide layer 117 has been deposited over the structure. The thickness of silicon oxide layer 117 ranges between 50 and 150 nm, and for example is 100 nm. Openings 119 have been formed from the upper surface of silicon oxide layer 117 to reach tungsten 113 of source and drain pre-contacts 116 and to reach gate nickel silicide 101 covering the portions of the gates located above insulation regions 77. A mask has been used to protect the portions of silicon oxide layer 117 which are not desired to be etched. Openings 119 have then been formed, for example, by an RIE-type etch method. Openings 119 have then been filled with tungsten 121. Openings 119 filled with tungsten 121 form the actual source and drain contacts 123 and gate contacts 125 of the MOS transistors, source and drain contacts 123 being connected to source and drain pre-contacts 116 obtained at the step illustrated in FIGS. 19A and 19B.

Specific embodiments have been described. Various alterations, modifications, and improvements will readily occur to those skilled in the art.

Although a specific example of a method for forming source, drain, and gate contacts on two adjacent MOS transistors having a common source/drain region, the concept of course applies to the case of a single MOS transistor per active area.

Although a specific example of a method for oxidizing gates comprising polysilicon covered with a nickel silicide has been described, the present invention applies to any metal silicide which, when laid on silicon and submitted to a thermal oxidation, buries into the silicon and covers with a silicon oxide.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a structure including gate, source, and drain contacts on a MOS transistor having an insulated gate comprising polysilicon covered with a metal gate silicide, this gate being surrounded with at least one spacer made of a first insulating material, the method comprising the steps of:
   a) covering the structure with a second insulating material and leveling the second insulating material to reach the gate silicide;
   b) oxidizing the gate so that the gate silicide buries and is covered with a silicon oxide;
   c) selectively removing the second insulating material; and
   d) covering the structure with a first conductive material and leveling the first conductive material all the way to a level lower at the top of said spacer;
   wherein, at step a), the second insulating material covering the structure is a silicon oxide, and wherein, at step c), the silicon oxide formed at step b) is also removed.

2. The method of claim 1, further comprising, after step d) of leveling of the first conductive material, the steps of:
   e) covering the structure with a layer of a third insulating material;
   f) forming openings in the third insulating material to reach said first conductive material; and
   g) filling the openings with a second conductive material.

3. The method of claim 2, wherein, at step e), the third insulating material covering the structure is of same nature as the second insulating material.

4. The method of claim 2, wherein, at step g), the second conductive material for filling said openings is of same nature as the first conductive material.

5. The method of claim 2, wherein the first and second conductive materials are formed of at least one conductive material selected from the group comprising tungsten, copper, titanium nitride, and tantalum nitride.

6. The method of claim 1, wherein the gate silicide is a silicide based on at least one metal selected from the group comprising nickel, cobalt, palladium, chromium, and platinum.

7. The method of claim 1, wherein said at least one spacer is a silicon nitride spacer.

8. The method of claim 1, wherein the gate is formed by deposition of a stack of conductive layers comprising a titanium nitride layer coated with a polysilicon layer and with a metal silicide.

9. The method of claim 1, wherein, at step b) of oxidation of the gate, the structure is taken to a temperature lower than 700° C., preferably lower than 600° C.

10. The method of claim 1, wherein the structure is formed on a layer of a first semiconductor material laid on an insulating layer itself laid on a substrate of a second semiconductor material.

11. The method of claim 10, further comprising, after the forming of the gate and before the forming of the gate silicide, a step at which the epitaxy of the source and drain regions is resumed.

12. The method of claim 11, wherein, for P-channel MOS transistors, formed in a layer of a first silicon semiconductor material, an epitaxial silicon-germanium layer is formed on the source and drain regions.

* * * * *